(12) United States Patent
Sculler et al.

(10) Patent No.: US 6,500,601 B1
(45) Date of Patent: Dec. 31, 2002

(54) METHOD OF MANUFACTURING PHOTOPOLYMER PLATES

(75) Inventors: Steven J. Sculler, Morganville, NJ (US); Colin J. Brunton, Rutland (GB); Alexander R. Veress, Somerville, NJ (US)

(73) Assignee: M&R Marking Systems, Inc., Piscataway, NJ (US)

( * ) Notice: Subject to any disclaimer, the term of this patent is extended or adjusted under 35 U.S.C. 154(b) by 0 days.

(21) Appl. No.: 09/439,468

(22) Filed: Nov. 15, 1999

Related U.S. Application Data
(60) Provisional application No. 60/149,567, filed on Aug. 18, 1999.

(51) Int. Cl.[7] ............................. G03F 7/038; G03F 7/40
(52) U.S. Cl. .................... 430/302; 430/306; 430/309; 430/328; 430/331; 430/394; 430/432
(58) Field of Search ...................... 430/302, 306, 430/309, 394, 328, 331, 432

(56) References Cited

U.S. PATENT DOCUMENTS

| | | | | |
|---|---|---|---|---|
| 4,202,696 A | * | 5/1980 | Takahashi et al. | 430/306 |
| 4,308,340 A | * | 12/1981 | Walls | 430/331 |
| 4,415,654 A | * | 11/1983 | Pohl | 430/328 |
| 4,603,058 A | * | 7/1986 | Adams | 427/54.1 |
| 4,716,094 A | * | 12/1987 | Minonishi et al. | 430/284 |
| 4,806,506 A | * | 2/1989 | Gibson, Jr. | 430/309 |
| 4,980,271 A | * | 12/1990 | Hsieh et al. | 430/331 |
| 5,259,311 A | | 11/1993 | McCaughey, Jr. | 101/401.1 |
| 6,197,459 B1 | * | 4/2001 | Leach | 430/18 |
| 6,399,278 B1 | * | 6/2002 | Leach | 430/284.1 |
| 6,403,269 B1 | * | 6/2002 | Leach | 430/18 |

FOREIGN PATENT DOCUMENTS

| | | | |
|---|---|---|---|
| EP | 0017927 A2 | * 10/1980 | |
| EP | 586 470 B1 | * 3/1998 | G03F/7/30 |

OTHER PUBLICATIONS

M&R Marking Systems' Instruction Manual (Undated) For Systems 1010 and 1020 Ideal Machines.

* cited by examiner

*Primary Examiner*—Janet Baxter
*Assistant Examiner*—Barbara Gilliam
(74) *Attorney, Agent, or Firm*—Lerner, David, Littenberg, Krumholz & Mentlik, LLP

(57) ABSTRACT

A method of manufacturing photopolymer marking structures is disclosed. The improved method results in a substantially tack-free marking structure.

16 Claims, 3 Drawing Sheets

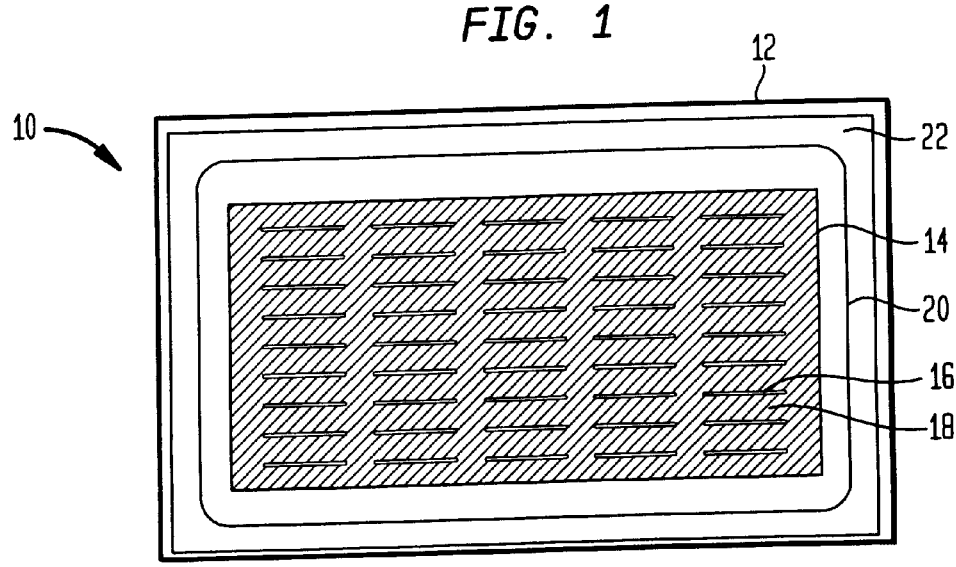
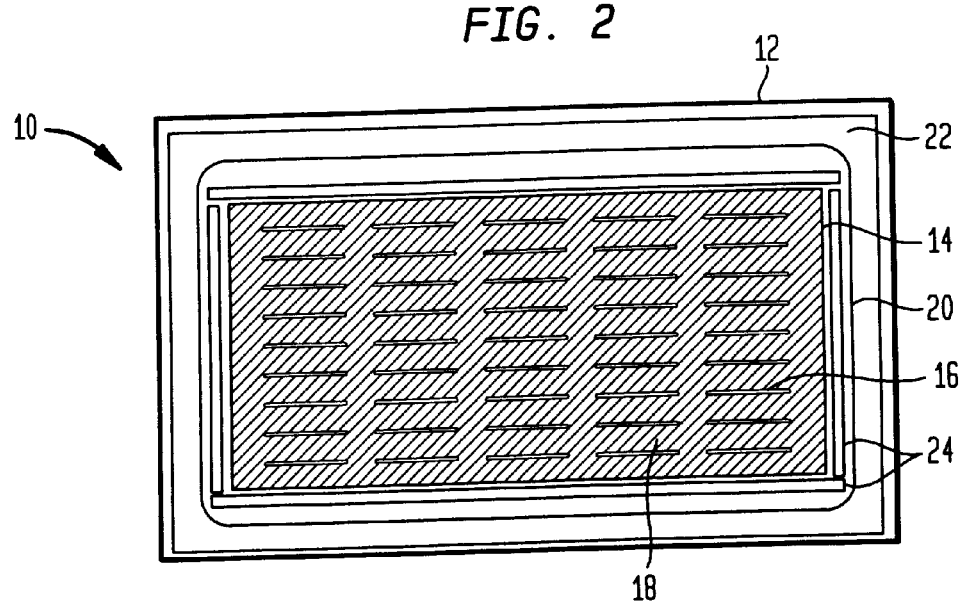

METHOD OF MANUFACTURING PHOTOPOLYMER PLATES

CROSS REFERENCE TO RELATED APPLICATIONS

This application claims the benefit of provisional patent application Ser. No. 60/149,567 filed on Aug. 18, 1999, the disclosure of which is incorporated by reference herein.

FIELD OF THE INVENTION

The present invention relates to methods of manufacturing marking structures. More particularly, the present invention relates to methods of manufacturing photopolymer marking structures.

BACKGROUND OF THE INVENTION

It is known to manufacture photopolymer printing plates by exposing a photosensitive material to ultraviolet ("UV") light. It is also known to use a negative film having transparent areas corresponding to a desired image pattern, where the UV light will pass through and cure the photopolymer to produce relief image areas of a desired photopolymer printing plate. The purpose of UV light is to cure, or at least partially cure, exposed areas of the photopolymer material. Other methods of curing desired areas of photopolymer printing plates have been used to manufacture marking devices and other devices made of photopolymer materials.

After the relief image areas are created through the use of negative film and UV light exposure, or other means, it is known to develop the exposed image areas by removing the photopolymer from the non-image areas (corresponding to black, nontransparent areas of the negative film). This can be done by washing the newly created photopolymer plate in a water/surfactant medium. Optionally, an air knife can be used as part of a polymer recovery step prior to washing the photopolymer printing plate.

It is common to then subject the partially manufactured photopolymer printing plate to a post exposure process which involves submerging it in a water based solution and then irradiating it with UV light.

A substantial problem with known methods of manufacturing photopolymer printing plates is that the finished product often has too much surface tack. This problem is particularly prevalent for photopolymer printing plates prepared from liquid resins. The surface tack problem is due, in part, to the inhibition by oxygen of the acrylate polymerization process at the plate surface. It is believed that all commercially available photopolymer printing plates rely on an acrylate polymerization mechanism to create the plate relief and characters.

Efforts have been made to overcome the problem of unwanted surface tack on photopolymer plates. However, all such efforts have been largely unsuccessful or suffer from additional problems.

For example, it is known to incorporate hydrogen abstracting photoinitiators, such as benzophenone, into the photopolymer formulation. It is also known to incorporate amine synergists into the photopolymer material. There are at least two problems associated with the incorporation of such compositions into the photopolymer material. First, photoinitiators are powerful absorbers of UV light especially at the surface of the photopolymer printing plate. This often results in undercutting of the plate characters. A second problem is that the addition of a hydrogen abstracting type photoinitiator can render the plate more susceptible to attack and subsequent degradation by stray UV light (e.g., daylight).

Long-chain fatty acids, such as myristic and palmitic acids, have also been added to photopolymer formulations in an attempt to manufacture a product free of surface tack. Such long chained fatty acids tend to bloom to the surface of the printing plate where a waxy layer is formed thereby rendering the surface substantially tack free. Although the incorporation of long-chain fatty acids may be effective to cover up and substantially eliminate surface tack, such approach has a substantial disadvantage in that it reduces the plate wetting tension and thus, results in poor pick up and transfer of ink.

Another way that the prior art has attempted to reduce surface tack is through the use of germicidal lamps at the post exposure stage as well as standard actinic lamps. This approach also has disadvantages. Namely, it is necessary to use an additional machine which adds substantial costs to the process. Further, the germicidal lamps emit short wave UV radiation that is harmful to the bulk physical properties of the photopolymer printing plate.

Other approaches at the post exposure stage include the incorporation of sodium sulfite, a salt, into a water solution to facilitate the removal of oxygen from the water. The intent of this approach is to again reduce the surface tack. However, the water/sodium sulfite solution has proven to be only marginally successful at reducing surface tack of the manufacturing photopolymer printing plate.

Another post exposure approach has been to add a surfactant into the post exposure water solution in an effort to reduce surface tack. It has been observed that this approach is successful when long-chain fatty acids are also added to the photopolymer formulation itself as discussed above. However, the use of surfactants in a water based solution have proven to be only marginally successful in reducing surface tack of the manufactured photopolymer printing plates.

A new method of manufacturing photopolymer marking structures is needed where the manufactured marking structure has a substantially tack-free surface but nonetheless has desirable ink pick up and transfer qualities.

SUMMARY AND OBJECTS OF THE INVENTION

The present invention overcomes the problems associated with prior art methods by providing new methods of manufacturing photopolymer marking structures that have a substantially tack-free surface while retaining desirable ink pick-up and transfer qualities.

In accordance with one aspect of the present invention, a method of manufacturing marking structures is provided. The method comprises forming a marking structure from a photopolymer material and subsequently placing the marking structure in a solution comprising water, a reducing agent and a surfactant.

It is preferable to expose the marking structure to UV light when the marking structure is immersed within the solution.

It is preferable for the reducing agent to comprises a salt such as sodium sulfite. However, various other reducing agents may be used in accordance with the scope of the present method.

The surfactant preferably comprises an alcohol sulfate such as sodium lauryl sulfate. One commercially manufactured alcohol sulfate is marketed under the trademark EMPICOL LXV. The surfactants used in the present invention presumably suspend or otherwise dissolve the uncured polymer into the aqueous phase, thus making it possible to clean the marking structure leaving it substantially free of uncured photopolymer.

In accordance with a preferred step of the present method, the solution in which the photopolymer marking structure is placed may comprise between about 70%–99.9% of water by weight. The solution may also comprise between about 0.01%–15% of the reducing agent by weight. It is also preferable for the solution to comprise between about 0.01%–15% of the surfactant by weight. The marking structure is preferably at least partially cured in the solution by exposure to UV light, other irradiation sources or other curing means such as chemical catalysis. It is a desired quality of the solution to substantially reduce or eliminate surface tack that would otherwise exist on the marking structure.

In a preferred embodiment, the solution may comprise between about 1%–5% of the reducing agent by weight and between about 1%–5% of the surfactant by weight.

In accordance with a preferred method of manufacturing marking structures, a desired amount of a photopolymer material is placed into a marking structure manufacturing device when the photopolymer material is in an uncured liquid state. The marking structure manufacturing device in which the photopolymer material is cured may include identified desired image areas while other areas are shielded. It is also preferable to expose the photopolymer material arranged at the desired identified image areas to an irradiation source whereby the exposed image areas become partially cured. Preferably, the irradiation source is a UV light source. However, in an embodiment where a light source is required, irradiation sources other than an UV light source may be used. It is also preferred to remove uncured portions of the photopolymer material after the photopolymer material has been exposed to the light source so that the partially cured image areas remain. The partially cured photopolymer marking structure are then placed in a solution comprising water, a reducing agent and a surfactant to remove surface tack. UV light or other curing means is preferably applied to the marking structure when it is in the solution to further cure it.

In a preferred and important aspect of the present invention, a solution comprising a reducing agent such as sodium sulfite, a surfactant and water is used as a post exposure solution in which the partially cured photopolymer marking structure is placed after such marking structure is at least partially cured through exposure to UV light or other curing means. Such a solution is significant for its contribution through the manufacturing process of creating a photopolymer marking structure having a substantially tack-free surface.

The present invention will be more fully understood when the following claims are considered in conjunction with the following detailed description of the preferred embodiments and associated drawings.

BRIEF DESCRIPTION OF THE DRAWINGS

FIG. 1 is a top plan schematic view of a support plate assembly of a preferred marking structure manufacturing device.

FIG. 2 is a top plan schematic view of the support plate assembly shown in FIG. 1 with an added frame.

DETAILED DESCRIPTION OF THE PREFERRED EMBODIMENTS

Figure 3:
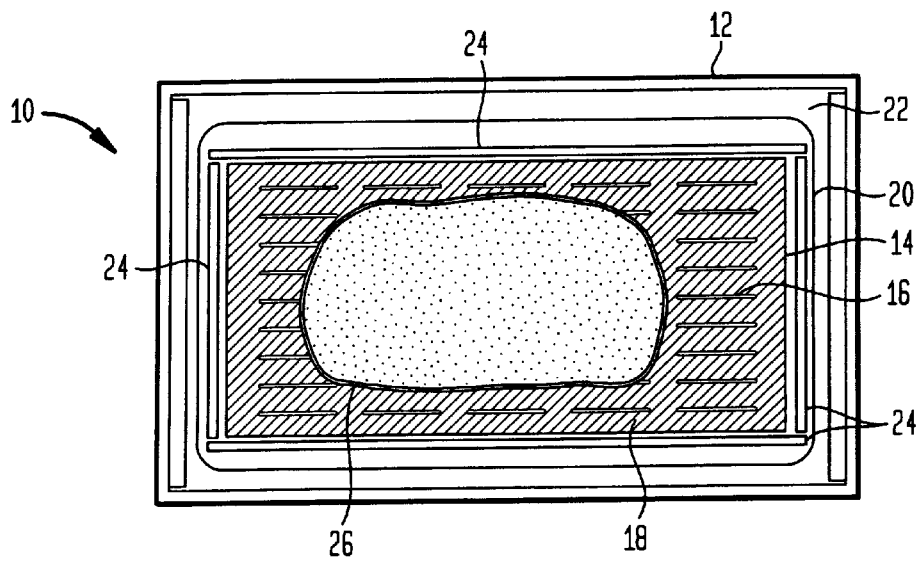
FIG. 3 is a top plan schematic view of the support plate assembly shown in FIG. 2 with a photopolymer in a liquid state arranged thereon.

A photopolymer marking structure manufactured in accordance with the present method is generally made of a polymeric material including photosensitive compositions that may be cured by exposure to an irradiation source. Preferably, the incident irradiation waves comprise UV light waves. However, other irradiation sources may be used with certain types of photopolymer materials in order to at least partially cure the material.

Portions of a support plate assembly intended for use with a marking structure manufacturing assembly used to form photopolymer marking structures are shown in FIGS. 1–4. FIG. 5 illustrates a marking structure manufacturing machine 26 that is intended to used with the support plate assembly 10 as shown in FIGS. 1–4 in accordance with the present method of manufacturing photopolymer marking structures.

More particularly as shown in FIGS. 1–4, the support plate 10 comprises a bottom glass plate 12 on which a negative film 14 is arranged.

In order to create a desired marking structure, it is known to first create the negative film 14. The negative film 14 is preferably used as a mask to shield UV light from certain areas of a photopolymer material while the area in the negative film that is clear (i.e., the image area) will allow UV light to pass through so that desired image patterns on the photopolymer material can be cured.

With respect to the negative film 14 of FIGS. 1–4, the exposed areas are designated by reference numeral 16 while the blackened areas that shield UV light from the photopolymer material are designated by reference numeral 18.

The background and image relief areas of a photopolymer material may be simultaneously exposed to UV light or may be successively exposed one area at a time. The exposed background forms the foundation (i.e., base) on which the image relief pattern is supported.

The portion of the support plate assembly 10 on which the photopolymer material is placed prior to exposure is shown in FIGS. 1–4 as a glass plate 12 on which the negative film 14 is placed. A solution of glycerin and water 20 is applied to the surface of the glass plate 12 to form a border around the negative film 14. A cover film 22 is then placed over the negative film 14 and the glycerin/water solution 20. A seal is formed between the cover film 22 and the glass plate 12 by the glycerin/water solution 20. The use of the glycerin/water solution 20 is optional. Alternate systems may use a vacuum channel to pull the cover film 22 down onto the negative film 14 and the glass plate 12. Other alternate systems may not require a seal of any type.

A frame made of a foam tape 24 (or other compressible material) is then placed on the cover film 22 in which a desired volume of photopolymer composition 26 in liquid form is poured prior to curing procedures. After the photopolymer composition 26 is poured onto the cover film 22, a substrate, such as a substantially translucent and flexible plastic, or glass, is placed on top of the liquid photopolymer composition 26 and is supported by the foam frame 24. This aspect of the present method is shown in FIG. 5. The foam frame 24 is an optional feature. Alternate systems may use a built in frame as a dam, or may entirely eliminate the frame.

It should be appreciated that the marking structure manufacturing devices shown in FIGS. 1–5 are known in the art. They are preferred devices used in conjunction with the present improved method to manufacture an improved photopolymer marking structure as discussed above and further below.

In order to assemble the support plate structure 10 on which the photopolymer marking structure will be manufactured, it is desirable to place the negative film 14 in the center of the glass support plate 12 as illustrated in FIG. 2. The images 16, such as letters and numbers, of the negative film 14 should be arranged in a right reading emulsion up position (as shown in FIGS. 2).

A small brush or a soft cloth may then be used to apply a solution that preferably comprises 50% water and 50% glycerin or the like about one half inch from the perimeter of the negative film 14 on the surface of the glass plate 12. Care should be taken not to apply too much of the glycerin/water solution 20 onto the glass plate 12 in order to avoid seepage of the solution onto the negative film 14.

The cover film 22 should then be placed over the entire negative film 14. The cover film 22 should also be placed over the glycerin/water border 20 applied on the surface of the glass plate 12. Preferably, the cover film 22 will not hang over the edges of the glass support plate 12.

Using a paint roller (not shown) or the like, apply light pressure to push the cover film 22 down toward the glass support plate 12. It is preferable to start rolling from the center of the cover film 22 and to push outwardly toward the edges thereof. This step will make the cover film 22 smooth and tight over the glass plate 12. At this stage, the support plate assembly 10 is shown in FIG. 1.

Figure 4:
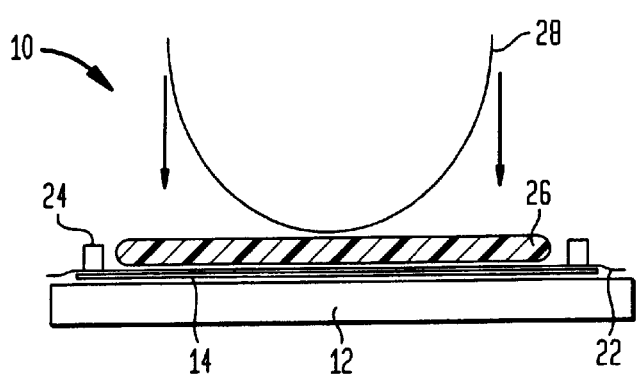
FIG. 4 is a partially cross section side view of the support plate assembly shown in FIG. 3 with a flexible substrate cover.
Figure 5:
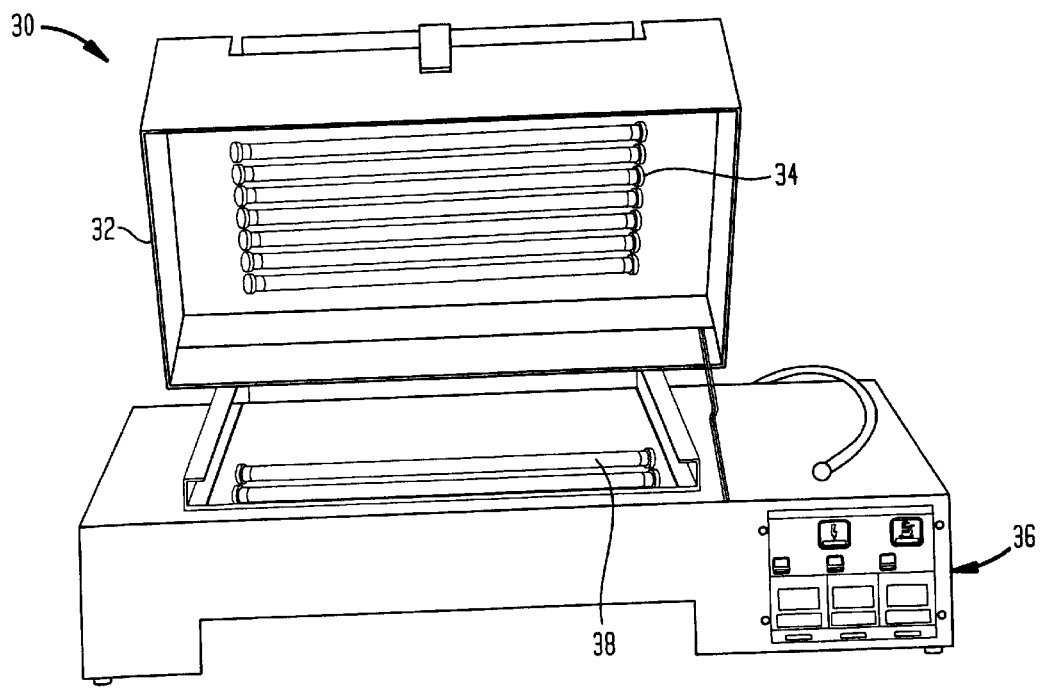
FIG. 5 is a perspective view of a marking structure manufacturing device shown in an open position for receiving the support plate assembly of FIGS. 1–4.

The frame 24 should then placed on the surface of the cover film 22 as illustrated in FIGS. 2–4. The frame 24 may be made of foam tape. In a preferred embodiment such as that shown in FIGS. 2–4, a small gap such as 0.125 inch, should be left between each strip of the foam. As is known, the foam frame 24 is generally used to help retain the photopolymer in its liquid state within the perimeter of the frame 24 prior to curing of the photopolymer composition 26.

As is also known in the art, the photopolymer composition should then be poured onto the cover film 22 overlaying the negative film 14 within the perimeter of the frame 24. This arrangement is shown in FIGS. 3 and 4.

After the photopolymer composition 26 is spread out and filled to a desired volume within the perimeter of the foam frame 24, a flexible substrate 28, such as a flexible and translucent plastic, should then be placed over the liquid photopolymer composition 26 as illustrated in FIG. 4. A top glass plate (also not shown) may then be placed on top of the flexible substrate 28. Clamps (not shown) may then be applied around the perimeter of the overall support plate assembly 10. This process and structure is also known.

The support plate assembly 10 with the liquid photopolymer composition 26 therein can then be placed in a photopolymer curing machine 30 (shown in FIG. 5) as is also known in the art. While various photopolymer curing machines may be used, highly desirable machines are sold by M&R Marking Systems, Inc. of Piscataway, N.J. under the IDEAL trademark as system 1010 and system 1020 machines.

As illustrated in FIG. 5, the photopolymer curing machine 30 includes a top lid 32 having top UV lamps 34 arranged therein and a bottom section 36 having bottom UV lamps 38 arranged therein. The top UV lamp 34 is used to partially cure the background support portion of the photopolymer marking structure while the bottom UV lamps 38 are used to partially cure the image relief patterns through the exposed areas 16 of the negative film 14.

After the initial exposure process is complete, the support plate assembly 10 including the partially cured photopolymer composition 26 therein is then removed from the exposure machine 30. The partially cured photopolymer marking structure is then removed from the support assembly 10 and may be subjected to a washing and brushing process where the unexposed portions of the photopolymer composition is removed and the exposed partially cured portions of the photopolymer composition remain so that a support base and image relief patterns are clearly visible.

The present invention contemplates the use of readily available photopolymers, examples of which are i40 marketed by M&R Marking, Inc. Piscataway, N.J., IDEAL 40, F 5000 and LF 55G all manufactured by McDermid The present invention also provides for the use of other polymeric formulations suitable for manufacturing marking stuctures.

The present method is particularly significant at this stage in the manufacturing process. The partially cured photopolymer marking structure should then be subjected to a post exposure process. The present method contemplates placing the partially cured photopolymer marking structure in a solution which comprises water, an reducing agent such as sodium sulfite and a surfactant such as alcohol sulfate (e.g., sodium lauryl sulfate) and olefin sulfonates.

This post exposure solution preferably includes the reducing agent (e.g., sodium sulfite) in an amount of between about 1%–5% by weight while the surfactant is also preferably present in an amount of between about 1%–5% by weight of the total solution. In other embodiments, the reducing agent and the surfactant may each comprise between about 0.01%–15% of the total solution by weight. In still another embodiment of the invention, the marking structure is exposed to UV light while it is immersed in the solution. While the use of higher percentages of the reducing agent and the surfactant come within the scope of the present invention, such higher percentages may cloud the water and may not be useful as the compositions may simply drop out of the solution.

While not intending to be bound to a particular theory of operation, it is believed that this solution suspends or otherwise dissolves redeposited uncured photopolymer which allows for easier and more facile cleaning of the surface of the cured photopolymer marking structure. The solution also may provide an environment more conducive to curing by sequestering dissolved oxygen in the aqueous medium, thus allowing the marking structure to further cure.

It should be appreciated that the present invention is not limited to the surfactants described herein or the use of sodium sulfite as a reducing agent. The combination of these compositions in the post exposure solution facilitate the creation of a substantially tack-free photopolymer marking structure.

While the foregoing detailed description describes preferred methods of manufacturing marking structures and preferred solutions used in such methods in accordance with the present invention, it should be appreciated that the invention is defined by the claims set forth below and is not intended to be limited to the preferred embodiments. Accordingly, those of skill in the art are encouraged to modify the preferred steps, components and compositions described herein while remaining within the scope of the present invention.

We claim:

1. A method of making the surface of a marking structure substantially tack-free, comprising the steps of:

providing an at least partially cured marking structure composed of a photopolymer material, said marking structure having at least one surface; and curing at least said surface of said at least partially cured marking structure while said surface is in contact with a solution including water, at least about 0.01% of a reducing agent by weight and at least about 1% of a surfactant by weight.

2. The method of claim 1 wherein said reducing agent comprises a salt.

3. The method of claim 1 wherein said reducing agent comprises sodium sulfite.

4. The method of claim 1 wherein said surfactant comprises an alcohol sulfate.

5. The method of claim 1 wherein said solution comprises between about 70%–99.9% of said water by weight.

6. The method of claim 1 further comprising the step of forming said marking structure by exposing selected portions of a desired amount of said photopolymer material in an uncured liquid state to an irradiation source whereby said photopolymer material is partially cured.

7. The method of claim 6 wherein said irradiation source comprises ultra violet light.

8. The method of claim 7 further comprising the step of removing uncured portions of said photopolymer material prior to said step of providing an at least partially cured marking structure.

9. A method of making the surface of a marking structure substantially free from surface tack comprising the steps of:

exposing selected portions of a desired amount of a photopolymer material, in an uncured state, to an irradiation source whereby said photopolymer material is partially cured;

removing at least a portion of any remaining uncured photopolymer material; and further curing at least a portion of said partially cured marking structure by exposure to an irradiation source while in contact with a solution including water, at least about 0.01% of a reducing agent by weight and at least about 1% of a surfactant by weight.

10. The method of claim 9 wherein said reducing agent comprises a salt.

11. The method of claim 9 wherein said reducing agent comprises sodium sulfite.

12. The method of claim 9 wherein said surfactant comprises an alcohol sulfate.

13. The method of claim 9 wherein said solution comprises between about 70%–99.9% of said water by weight.

14. The method of claim 1 or 9 wherein said solution includes no more than about 15% by weight of each of said reducing agent and said surfactant.

15. A method of making the surface of a marking structure substantially tack-free, comprising the steps of:

providing an at least partially cured marking structure composed of a photopolymer material, said marking structure having at least one surface; and curing at least said surface of said at least partially cured marking structure while said surface is in contact with a solution including water, between about 1% and about 15% of a reducing agent by weight and between about 1% and about 15% of a surfactant by weight.

16. A method of making the surface of a marking structure substantially free from surface tack comprising the steps of:

exposing selected portions of a desired amount of a photopolymer material, in an uncured state, to an irradiation source whereby said photopolymer material is partially cured;

removing at least a portion of any remaining uncured photopolymer material; and further curing at least a portion of said partially cured marking structure by exposure to an irradiation source while in contact with a solution including water, between about 1% and about 15% of a reducing agent by weight and between about 1% and about 15% of a surfactant by weight.

* * * * *

UNITED STATES PATENT AND TRADEMARK OFFICE
CERTIFICATE OF CORRECTION

PATENT NO.     : 6,500,601 B1
DATED          : December 31, 2002
INVENTOR(S)    : Steven J. Sculler, Colin J. Brunton and Alexander R. Veress It is certified that error appears in the above-identified patent and that said Letters Patent is hereby corrected as shown below:

<u>Column 8,</u>
Line 11, "The method of claim 1 or 9" should read -- The method of claims 1 or 9 --.

Signed and Sealed this

Fifteenth Day of July, 2003

JAMES E. ROGAN
*Director of the United States Patent and Trademark Office*